(12) United States Patent
Pan et al.

(10) Patent No.: US 8,912,631 B2
(45) Date of Patent: Dec. 16, 2014

(54) HIGH ON-STATE BREAKDOWN HETEROJUNCTION BIPOLAR TRANSISTOR

(75) Inventors: Noren Pan, Wilmette, IL (US); Andree Wibowo, Des Plaines, IL (US)

(73) Assignee: MicroLink Devices, Inc., Niles, IL (US)

( * ) Notice: Subject to any disclaimer, the term of this patent is extended or adjusted under 35 U.S.C. 154(b) by 0 days.

(21) Appl. No.: 13/038,045

(22) Filed: Mar. 1, 2011

(65) Prior Publication Data

US 2011/0147799 A1 Jun. 23, 2011

Related U.S. Application Data

(60) Continuation of application No. 12/731,719, filed on Mar. 25, 2010, now abandoned, which is a division of application No. 11/153,078, filed on Jun. 14, 2005, now Pat. No. 7,687,886.

(60) Provisional application No. 60/603,011, filed on Aug. 19, 2004.

(51) Int. Cl.
*H01L 27/082* (2006.01)
*H01L 29/08* (2006.01)
*H01L 29/737* (2006.01)

(52) U.S. Cl.
CPC ........ *H01L 29/0817* (2013.01); *H01L 29/0821* (2013.01); *H01L 29/7371* (2013.01)
USPC .................... 257/565; 257/586; 257/E29.171

(58) Field of Classification Search
USPC .................. 257/565–593, E29.171–E29.202; 438/309–378
See application file for complete search history.

(56) References Cited

U.S. PATENT DOCUMENTS

| | | | |
|---|---|---|---|
| 5,336,909 A * | 8/1994 | Katoh et al. | 257/197 |
| 6,043,520 A | 3/2000 | Yamamoto et al. | |
| 6,423,990 B1 * | 7/2002 | El-Sharawy et al. | 257/197 |
| 2001/0016366 A1 | 8/2001 | Sasaki et al. | |
| 2003/0025179 A1 | 2/2003 | Pan et al. | |
| 2003/0136956 A1 * | 7/2003 | Niwa et al. | 257/12 |
| 2004/0065897 A1 * | 4/2004 | Lee et al. | 257/197 |

FOREIGN PATENT DOCUMENTS

| | | |
|---|---|---|
| JP | 2-291135 | 11/1990 |
| JP | 6-310521 | 11/1994 |
| JP | 6-326120 | 11/1994 |
| JP | 7-161727 | 6/1995 |
| JP | 2001-326229 | 11/2001 |

OTHER PUBLICATIONS

Notice of Reasons for Rejection issued in corresponding Japanese Patent Application No. 2005-236862 mailed Nov. 30, 2010.

* cited by examiner

*Primary Examiner* — Tucker Wright
(74) *Attorney, Agent, or Firm* — McCarter & English, LLP

(57) ABSTRACT

A heterojunction bipolar transistor (HBT) is provided with an improved on-state breakdown voltage $V_{CE}$. The improvement of the on-state breakdown voltage for the HBT improves the output power characteristics of the HBT and the ability of the HBT to withstand large impedance mismatch (large VSWR). The improvement in the on-state breakdown voltage is related to the suppression of high electric fields adjacent a junction of a collector layer and a sub-collector layer forming a collector region of the HBT.

19 Claims, 8 Drawing Sheets

HIGH ON-STATE BREAKDOWN HETEROJUNCTION BIPOLAR TRANSISTOR

RELATED APPLICATIONS

This application is a continuation of U.S. application Ser. No. 12/731,719, filed on Mar. 25, 2010, which is a divisional of U.S. application Ser. No. 11/153,078, filed on Jun. 14, 2005, which is now U.S. Pat. No. 7,687,886 B2, issued on Mar. 30, 2010, which claims the benefit of U.S. Provisional Application No. 60/603,011, filed on Aug. 19, 2004, the entire contents of each application are incorporated herein by reference in their entirety.

STATEMENT OF GOVERNMENT INTEREST

This invention was made with Government support under contract # W31P4Q-08-C-0421 awarded by DARPA. The Government has certain rights in the invention.

BACKGROUND OF THE INVENTION

This invention relates generally to semiconductor transistors. In particular, the invention relates to heterojunction bipolar transistors. Heterojunction bipolar transistors (HBTs) offer a much higher speed of operation than the more prevalent metal oxide semiconductor field effect transistors (MOSFETs) or even conventional homojunction bipolar transistors, e.g., pnp or npn silicon transistors. Because HBTs offer high speed, high current driving capability, and low 1/f noise levels, HBTs are becoming popular for use as integrated switching devices and power amplifier devices in wireless communication systems and subsystems, satellite broadcast systems, automobile collision avoidance systems, global positioning systems, and other high frequency applications. One application in which HBT use continues to increase is in the design and manufacture of wireless electronic devices, such as wireless telephones and other like electronic devices that are capable of communicating with a network in a wireless manner.

As with all wireless electronic devices, the output power characteristics of a power amplifier along with the amplifier's ability to withstand large voltage swings is a concern to both the designer and consumer of the portable wireless device. For example, it is desirable to maximize output power and reliability of the wireless electronic device by providing the device with one or more HBT power amplifiers that maximize power performance and high frequency performance and thus, broad bandwidth operation capability. By providing the wireless electronic device with an HBT power amplifier having an improved on-state breakdown capability often results in a desirable increase in the reliability of the amplifier by improving the ability of the amplifier to withstand large voltage swings. As such, the use of an HBT power amplifier having an improved on-state breakdown capability improves output power characteristics and the ruggedness or the ability of the amplifier to withstand large voltage swings benefits a mobile telephone supporting a digital wireless telephone standard, such as the global system for mobile communication (GSM). Moreover, it is desirable to increase the reliability of an HBT power amplifier provided in a wireless electronic device by lowering the intensity of electric fields within a selected region of the HBT power amplifier.

SUMMARY OF THE INVENTION

The present invention addresses the above-described problems associated with electronic devices that transmit digital wireless communications. The present invention discloses structures for GaAs HBT power amplifiers having an improved on-state breakdown voltage ($V_{CE}$) and thus, improved output power characteristics and improved ability to withstand large voltage swings, amongst other benefits. The improvements provided in an HBT device are accomplished by suppression of high electric fields near the collector/sub-collector junction when the HBT device is operating at high current densities and high voltage operations. By insertion of a high doping level layer near the collector/sub-collector junction or by insertion of a large bandgap material the present invention suppresses the high electric fields near the collector/sub-collector junction to result in an HBT device having an improved on-state breakdown voltage value.

In one embodiment of the present invention, a heterojunction bipolar transistor is disclosed having a collector region configured to reduce an electric field adjacent to two of the layers forming the region to improve a drain source on-state breakdown voltage. The heterojunction bipolar transistor includes a substrate, a collector region, a base region, an emitter region, and a contact region. The collector region includes a number of layers of a first material. Each of the layers of the first material has a distinct impurity concentration. The base region has at least one layer of the first material. The emitter region has at least one layer of a second material and the contact region has a first layer of the first material and a second layer of a third material.

The collector region includes a sub-collector layer of the first material, a first collector layer of the first material, a second collector layer of the first material, and a third collector layer of the first material. The first material includes GaAs.

The first collector layer has a thickness of about 200 nm and a donor impurity concentration of between about $7 \times 10^{16}$ cm$^{-3}$ and about $10 \times 10^{16}$ cm$^{-3}$. The second collector layer has a thickness of about 200 nm. The third collector layer has a thickness of about 400 nm.

The second material includes InGaP and the third material includes $In_{0.5}Ga_{0.5}As$.

In one embodiment of the present invention, a heterojunction bipolar transistor is disclosed having a collector region configured to reduce an electric field adjacent to two of the layers forming the region to improve a drain source on-state breakdown voltage. The heterojunction bipolar transistor includes a substrate, a collector region, a base region, an emitter region, and a contact region. The collector region includes a number of layers of a first material. Each of the layers of the first material has a distinct impurity concentration. The base region has at least one layer of the first material. The emitter region has at least one layer of a second material and the contact region has a first layer of the first material and a second layer of a third material.

The collector region includes a sub-collector layer of the first material, a first collector layer of the first material, a second collector layer of the first material, and a third collector layer of the first material. The first material includes GaAs.

The first collector layer has a thickness of about 200 nm and a donor impurity concentration of between about $7 \times 10^{16}$ cm$^{-3}$ and about $10 \times 10^{16}$ cm$^{-3}$. The second collector layer has a thickness of about 200 nm. The third collector layer has a thickness of about 400 nm.

The second material includes $Al_xGa_{1-x}As$ ($0<x<0.35$) and the third material includes $In_{0.5}Ga_{0.5}As$.

In another embodiment of the present invention, a heterojunction bipolar transistor is disclosed having a collector region configured to reduce an electric field adjacent to two of the layers forming the region to improve a drain source on-state breakdown voltage. The heterojunction bipolar transistor includes a substrate, a collector region, a base region, an emitter region, and a contact region. The collector region includes a number of layers of a first material. Each of the layers of the first material has a distinct impurity concentration. The base region has at least one layer of the first material. The emitter region has at least one layer of a second material and the contact region has a first layer of the first material and a second layer of a third material.

The collector region includes a sub-collector layer of the first material, a first collector layer of the first material, a second collector layer of the first material, and a third collector layer of the first material. The first material includes GaAs.

The first collector layer has a thickness of about 200 nm and a donor impurity concentration of between about $7 \times 10^{16}$ cm$^{-3}$ and about $10 \times 10^{16}$ cm$^{-3}$. The second collector layer has a thickness of about 200 nm. The third collector layer has a thickness of about 400 nm.

The second material includes $(Al_xGa_{1-x})_{0.49}In_{0.51}P$ ($0<x<0.35$) and the third material includes $In_{0.5}Ga_{0.5}As$.

In another embodiment of the present invention, a heterojunction bipolar transistor is disclosed having a collector region configured to reduce an electric field adjacent to two adjacent layers of a number of layers forming the collector region. The reduction in the electric field improves a drain-source on-state breakdown voltage of the heterojunction bipolar transistor. The heterojunction bipolar transistor includes a substrate, a collector region, a base region, an emitter region, and a contact region.

The collector region includes a number of layers of a first material and a layer of a second material. Each of the layers of the first and second materials has a distinct impurity concentration. The base region includes at least one layer of the first material. The emitter region includes at least one layer of a third material. The contact region includes a first layer of the first material and a second layer of a fourth material.

The first material includes GaAs. The second material includes AlGaAs. The third material includes InGaP. The fourth material includes $In_{0.5}Ga_{0.5}As$.

The layers of the first material forming the collector region include a sub-collector layer of the first material, a first collector layer of the first material, and a second collector layer of the first material.

The first collector layer of the first material has a thickness of about 200 nm. The second collector layer of the first material has a thickness of about 400 nm. The sub-collector layer has a thickness of about 400 nm. The layer of the second material forming the collector region has a thickness of about 200 nm and has a donor impurity concentration of between about $7 \times 10^{16}$ cm$^{-3}$ and about $10 \times 10^{16}$ cm$^{-3}$.

BRIEF DESCRIPTION OF THE DRAWINGS

The foregoing and other objects, features and advantages of the invention will be apparent from the following description, and from the accompanying drawings, in which like reference characters refer to the same parts throughout the different views. The drawings illustrate principles of the invention and are not to scale.

DETAILED DESCRIPTION

Figure 1:
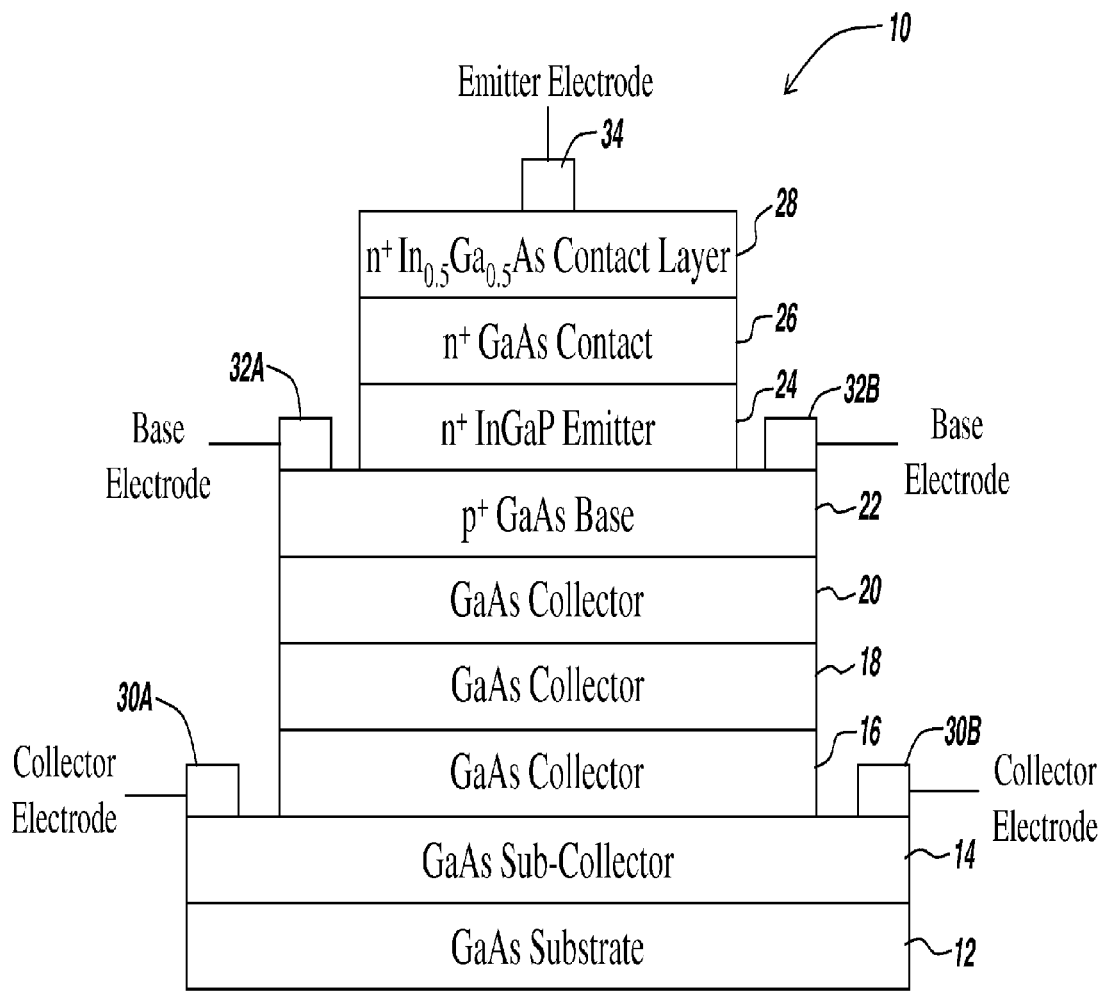
FIG. 1 is a cross-sectional view of a heterojunction bipolar transistor according to a first illustrative embodiment of the present invention.

The compound semiconductor device of the present invention advantageously employs either a highly doped layer near the collector/sub-collector junction of the device or a layer of material near the collective/sub-collector junction of the device having a large bandgap to allow the compound semiconductor device to realize an improved $V_{CE}$. The improved $V_{CE}$ realized by the semiconductor device of the present invention improves the output power characteristics of the device along with the ability of the device to withstand large voltage mismatch (high VSWR) (Voltage Standing Wave Ratio). Those skilled in the art will appreciate that an impedance mismatch of a power amplifier can be very high (e.g., VSWR>10) when the power amplifier undergoes significant changes in operation. Nonetheless, the teachings of the present invention, discloses an HBT structure suitable to provide a power amplifier capable of operating under conditions of VSWR>15 and a $V_{CE}$ greater than 5V.

The improved on-state breakdown voltage $V_{CE}$ results from the suppression or reduction of high electric fields near the collector/sub-collector junction of the compound semiconductor device. That is, the electric field at the collector/sub collector junction is reduced to less than $2 \times 10^4$ V/cm.

The compound semiconductor devices of the present invention are particularly suitable for use in applications where the compound semiconductor device operates as a power amplifier and are fabricated from a GaAs material. Specifically, each illustrative embodiment of the present invention described below is directed to a GaAs based HBT device for use in a portable or a mobile electronic device, such as a cellular telephone, a laptop computer with wireless modem and other like portable consumer or non-consumer (e.g., military) device or other like or similar wireless communication application that supports transmission of digital data. For example, one such portable device is a mobile telephone configured to digitize and compress data, and transmit the data in wireless fashion across a channel with other streams of digitized compressed data, each in its own time slot. The compound semiconductor device of the present invention is configurable to suit a selected application as illustrated in the exemplary embodiments described in more detail below.

The compound semiconductor device of the present invention provides a range of significant benefits to engineers that design electronic devices that are capable of transmitting data in a GSM compatible network for wireless communications. The compound semiconductor device of the present invention can extend or improve the on-state breakdown voltage of the device to improve the output power characteristics of the device and the ability of the device to withstand large voltage swings. The compound semiconductor device of the present invention is able to extend or improve on-state breakdown voltage of a GaAs HBT by suppressing or reducing the strength of electric fields produced near the junction of a collector layer and a sub-collector layer of the HBT device when the device is operating at high current densities and high voltage operations. For example, the improvement in the on-state breakdown can be realized at current densities from 20 kA/cm$^2$ to 100 kA/cm$^2$ and at V$_{CE}$ from 5V to 16V. In this manner, the GaAs HBTs of the present invention are well suited for applications that transmit compressed digitized data in a wireless manner.

FIG. 1 illustrates a cross sectional view of an HBT according to a first illustrative embodiment of the present invention. The HBT 10 is formed on a substrate and includes a collector region, a base region, an emitter region, and a contact region. The collector region of the HBT 10 includes a sub-collector layer 14, a first collector layer 16, a second collector layer 18, and a third collector layer 20. The base region of the HBT 10 includes a base layer 22. In similar fashion, the emitter region of the HBT 10 includes an emitter layer 24. The contact region of the HBT 10 includes a first contact layer 26 and a second contact layer 28. The HBT 10 further includes an emitter electrode 34 formed over a portion of the second contact layer 28, base electrodes 32A and 32B formed over portions of the base layer 22, and collector electrodes 30A and 30B formed over portions of the sub-collector layer 14.

In more detail, the sub-collector layer 14 is a GaAs material formed over a GaAs substrate 12. The sub-collector layer 14 has a thickness of about 400 nm with a donor impurity concentration of about 4×10$^{18}$ cm$^{-3}$.

The first collector layer 16 is formed of a GaAs material over a portion of the sub-collector layer 14. The first collector layer 16 can have a thickness range of between about 200 nm and about 400 nm. The first collector layer 16 can have a donor impurity concentration of between about 7×10$^{16}$ cm$^{-3}$ and about 10×10$^{16}$ cm$^{-3}$. In one embodiment the first collector layer 16 has a thickness of about 200 nm and a donor impurity concentration of about of about 7×10$^{16}$ cm$^{-3}$.

The second collector layer 18 is formed of a GaAs material over a portion of the first collector layer 16. The second collector layer 18 has a thickness that can range from between about 200 nm to about 400 nm in 1 nm increments or decrements. The donor impurity concentration of the second collector layer 18 can range between about 4×10$^{16}$ cm$^{-3}$ and about 7×10$^{16}$ cm$^{-3}$. In one embodiment, the second collector layer 18 has a thickness of about 200 nm and a donor impurity concentration of about 5×10$^{16}$ cm$^{-3}$.

The third collector layer 20 is formed of a GaAs material over a portion of the second collector layer 18. The third collector layer 20 has a thickness of between about 100 nm and about 500 nm. The range of thicknesses can change in increments or decrements of 1 nm. The donor impurity concentration of the third collector layer 20 can range between about 0.5×10$^{16}$ cm$^{-3}$ and about 4×10$^{16}$ cm$^{-3}$. In one embodiment, the third collector layer 20 has a thickness of about 400 nm and a donor impurity concentration of about 1×10$^{16}$ cm$^{-3}$.

For the base layer 22, a P$^+$ type GaAs material is formed over a portion of the third collector layer 20 and is formed to have a thickness of about 100 nm. The base layer 22 is doped to have an impurity concentration of between about 1×10$^{19}$ cm$^{-3}$ and about 5×10$^{19}$ cm$^{-3}$.

For the emitter layer 24, an N$^+$ type InGaP material is formed over a portion of the base layer 22 to a thickness of about 50 nm with a donor impurity concentration of about 3×10$^{17}$ cm$^{-3}$.

The first contact layer 26 is formed of a GaAs material doped with N$^+$ type impurities to a concentration of about 4×10$^{18}$ cm$^{-3}$. The first contact layer 26 is formed over a portion of the emitter layer 24 and is formed to have a thickness of about 100 nm. The second contact layer 28 is formed over a portion of the first contact layer 26 of an In$_{0.5}$Ga$_{0.5}$As material doped with N$^+$ type impurities in a concentration above 1×10$^{19}$ cm$^{-3}$.

The improvement in the on-state voltage breakdown V$_{CE}$ in the above illustrative embodiment of the compound semiconductor device is accomplished by the insertion of a higher doped collector layer near the sub-collector layer to reduce the electric field at the junction of the collector and the sub-collector of the HBT 10. The introduction of collector layer having a donor impurity concentration of between about 7×10$^{16}$ cm$^{-3}$ and about 10×10$^{16}$ cm$^{-3}$ adjacent to a sub-collector layer reduces the electric field at the collector/sub-collector junction which avoids the occurrence of avalanche breakdown at this junction.

The electric field at the junction of a sub-collector layer and a collector layer is reduced from between about 6×10$^4$ V/cm to about 8×10$^4$ V/cm to a reduced level of between about 2×10$^4$ V/cm to about 3×10$^4$ V/cm. The reduction in the electric field results in an improvement of an on-state breakdown voltage V$_{CE}$ value of between about 9V and about 10V at a collector current density of about 80 kA/cm$^2$. As a result, the HBT 10 is able to realize an improvement in on-state breakdown voltage V$_{CE}$, thus improved output power characteristics and the ability to withstand large voltage swings to result in an improvement in device reliability and operational performance.

Figure 1A:
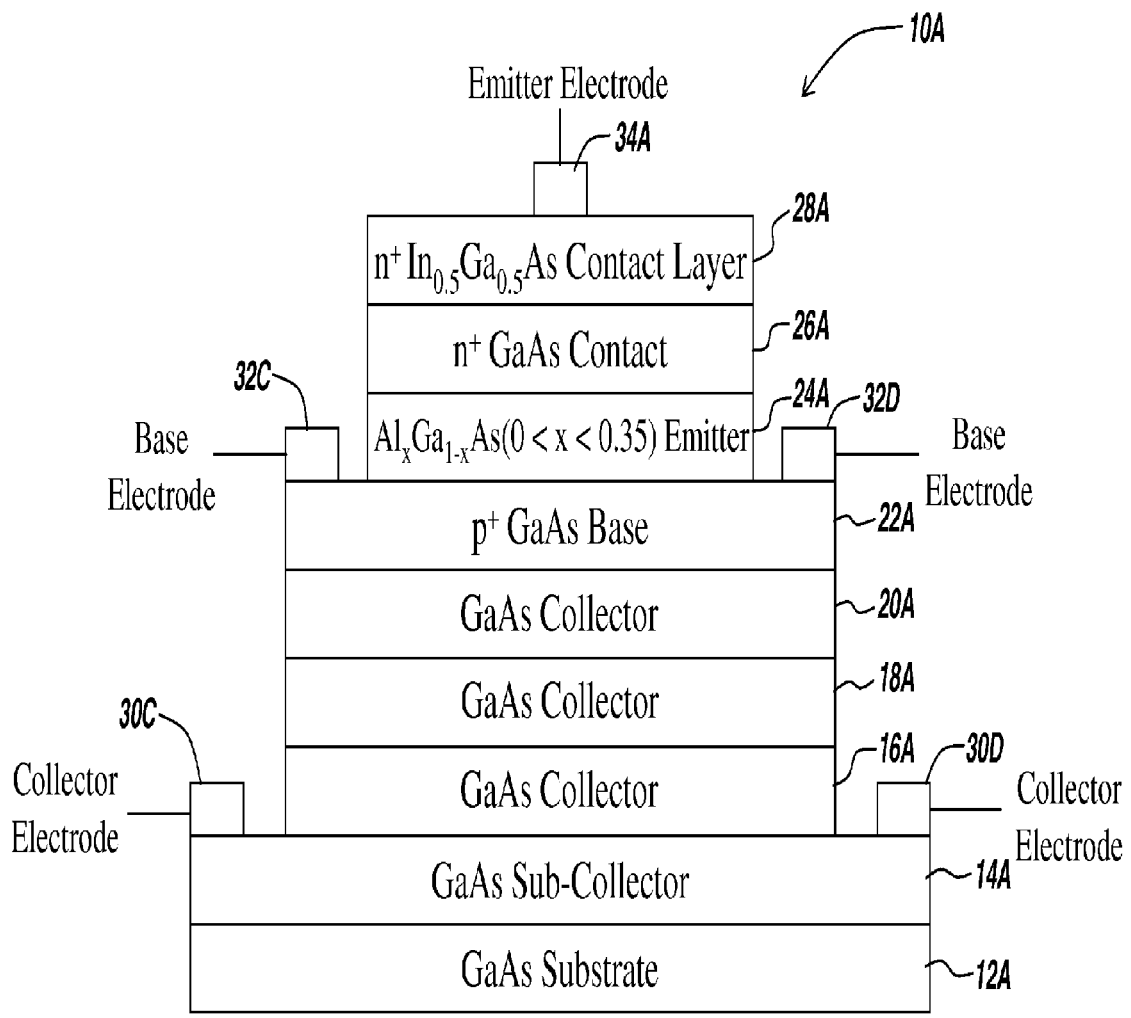
FIG. 1A is a cross-sectional view of a heterojunction bipolar transistor according to a second illustrative embodiment of the present invention.

FIG. 1A illustrates a cross sectional view of an HBT according to a second illustrative embodiment of the present invention. The HBT 10A is formed on a substrate and includes a collector region, a base region, an emitter region, and a contact region. The collector region of the HBT 10A includes a sub-collector layer 14A, a first collector layer 16A, a second collector layer 18A, and a third collector layer 20A. The base region of the HBT 10A includes a base layer 22A. In similar fashion, the emitter region of the HBT 10A includes an emitter layer 24A. The contact region of the HBT 10A includes a first contact layer 26A and a second contact layer 28A. The HBT 10A further includes an emitter electrode 34A formed over a portion of the second contact layer 28A, base electrodes 32C and 32D formed over portions of the base layer 22A, and collector electrodes 30C and 30D formed over portions of the sub-collector layer 14A.

In more detail, the sub-collector layer 14A is a GaAs material formed over a GaAs substrate 12A. The sub-collector layer 14A has a thickness of about 400 nm with a donor impurity concentration of about 4×10$^{18}$ cm$^{-3}$.

The first collector layer 16A is formed of a GaAs material over a portion of the sub-collector layer 14A. The first collector layer 16A can have a thickness range of between about 200 nm and about 400 nm. The first collector layer 16A can have a donor impurity concentration of between about 7×10$^{16}$ cm$^{-3}$ and about 10×10$^{16}$ cm$^{-3}$. In one embodiment, the first collector layer 16A has a thickness of about 200 nm and a donor impurity concentration of about of about 7×10$^{16}$ cm$^{-3}$.

The second collector layer 18A is formed of a GaAs material over a portion of the first collector layer 16A. The second collector layer 18A has a thickness that can range from between about 200 nm to about 400 nm in 1 nm increments or decrements. The donor impurity concentration of the second collector layer 18A can range between about 4×10$^{16}$ cm$^{-3}$ and about 7×10$^{16}$ cm$^{-3}$. In one embodiment, the second collector layer 18A has a thickness of about 200 nm and a donor impurity concentration of about $5 \times 10^{16}$ cm$^{-3}$.

The third collector layer 20A is formed of a GaAs material over a portion of the second collector layer 18A. The third collector layer 20A has a thickness of between about 100 nm and about 500 nm. The range of thicknesses can change in increments or decrements of 1 nm. The donor impurity concentration of the third collector layer 20A can range between about $0.5 \times 10^{16}$ cm$^{-3}$ and about $4 \times 10^{16}$ cm$^{-3}$. In one embodiment, the third collector layer 20A has a thickness of about 400 nm and a donor impurity concentration of about $1 \times 10^{16}$ cm$^{-3}$.

For the base layer 22A, a P$^+$ type GaAs material is formed over a portion of the third collector layer 20A and is formed to have a thickness of about 100 nm. The base layer 22A is doped to have an impurity concentration of between about $1 \times 10^{19}$ cm$^{-3}$ and about $5 \times 10^{19}$ cm$^{-3}$.

For the emitter layer 24A, a Al$_x$Ga$_{1-x}$As (0<x<0.35) type material is formed over a portion of the base layer 22A to have a thickness of about 50 nm with a doping concentration between about $3 \times 10^{17}$ cm$^{-3}$ and about $10 \times 10^{17}$ cm$^{-3}$.

The first contact layer 26A is formed of a GaAs material doped with N$^+$ type impurities to a concentration of about $4 \times 10^{18}$ cm$^{-3}$. The first contact layer 26A is formed over a portion of the emitter layer 24A and is formed to have a thickness of about 100 nm. The second contact layer 28A is formed over a portion of the first contact layer 26A of an In$_{0.5}$Ga$_{0.5}$As material doped with N$^+$ type impurities in a concentration above $1 \times 10^{19}$ cm$^{-3}$.

The improvement in the on-state voltage breakdown V$_{CE}$ in the above illustrative embodiment of the compound semiconductor device is accomplished by the insertion of a higher doped collector layer near the sub-collector layer to reduce the electric field at the junction of the collector and the sub-collector of the HBT 10A. The introduction of collector layer having a donor impurity concentration of between about $7 \times 10^{16}$ cm$^{-3}$ and about $10 \times 10^{16}$ cm$^{-3}$ adjacent to a sub-collector layer reduces the electric field at the collector/sub-collector junction which avoids the occurrence of avalanche breakdown at this junction.

The electric field at the junction of a sub-collector layer and a collector layer is reduced from between about $6 \times 10^4$ V/cm to about $8 \times 10^4$ V/cm to a reduced level of between about $2 \times 10^4$ V/cm to about $3 \times 10^4$ V/cm. The reduction in the electric field results in an improvement of an on-state breakdown voltage V$_{CE}$ value of between about 9V and about 10V at a collector current density of about 80 kA/cm$^2$. As a result, the HBT 10A is able to realize an improvement in on-state breakdown voltage V$_{CE}$, thus improved output power characteristics and the ability to withstand large voltage swings to result in an improvement in device reliability and operational performance.

Figure 1B:
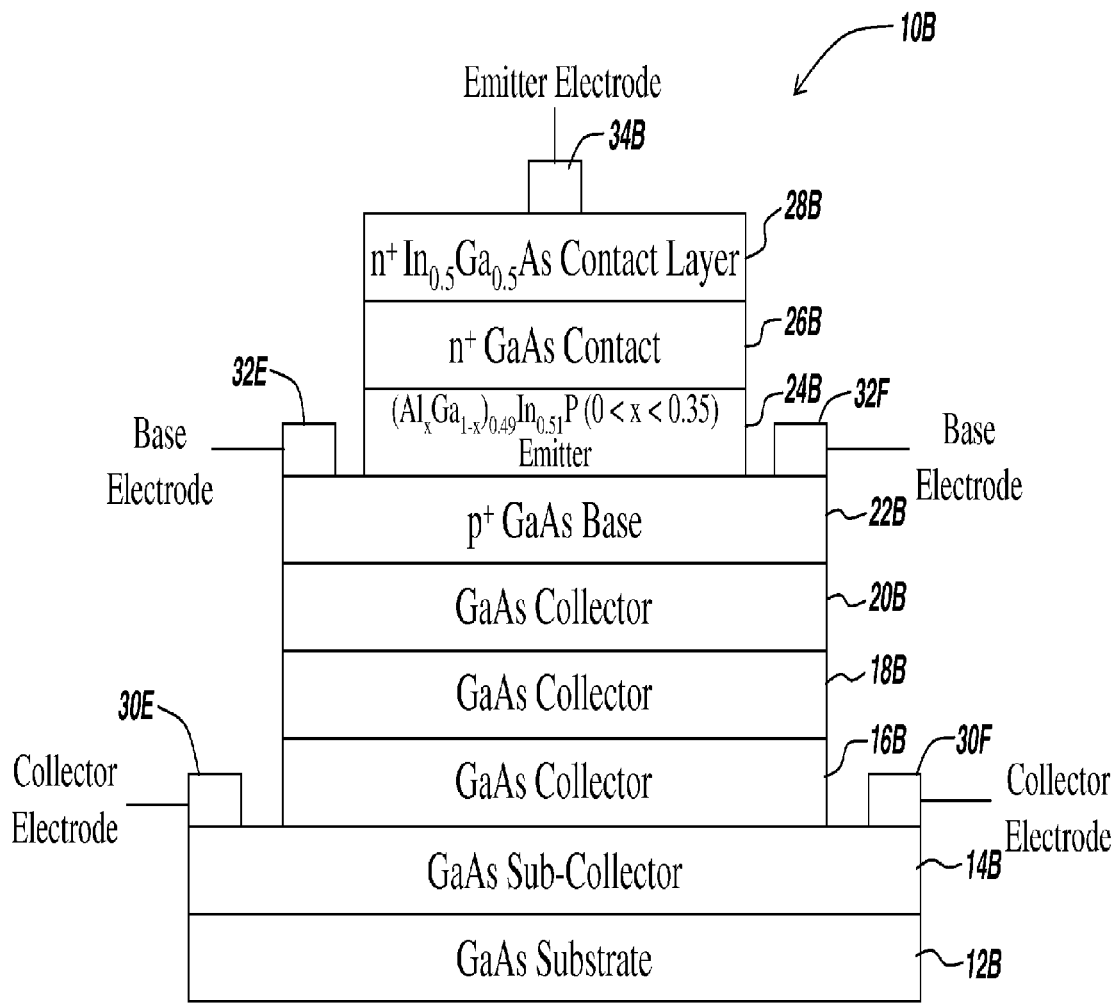
FIG. 1B is a cross-sectional view of a heterojunction bipolar transistor according to a third illustrative embodiment of the present invention.

FIG. 1B illustrates a cross sectional view of an HBT according to another illustrative embodiment of the present invention. The HBT 10B is formed on a substrate and includes a collector region, a base region, an emitter region, and a contact region. The collector region of the HBT 10B includes a sub-collector layer 14B, a first collector layer 16B, a second collector layer 18B, and a third collector layer 20B. The base region of the HBT 10B includes a base layer 22B. In similar fashion, the emitter region of the HBT 10B includes an emitter layer 24B. The contact region of the HBT 10B includes a first contact layer 26B and a second contact layer 28B. The HBT 10B further includes an emitter electrode 34B formed over a portion of the second contact layer 28B, base electrodes 32E and 32F formed over portions of the base layer 22B, and collector electrodes 30E and 30F formed over portions of the sub-collector layer 14B.

In more detail, the sub-collector layer 14B is a GaAs material formed over a GaAs substrate 12B. The sub-collector layer 14B has a thickness of about 400 nm with a donor impurity concentration of about $4 \times 10^{18}$ cm$^{-3}$.

The first collector layer 16B is formed of a GaAs material over a portion of the sub-collector layer 14B. The first collector layer 16B can have a thickness range of between about 200 nm and about 400 nm. The first collector layer 16B can have a donor impurity concentration of between about $7 \times 10^{16}$ cm$^{-3}$ and about $10 \times 10^{16}$ cm$^{-3}$. In one embodiment, the first collector layer 16B has a thickness of about 200 nm and a donor impurity concentration of about of about $7 \times 10^{16}$ cm$^{-3}$.

The second collector layer 18B is formed of a GaAs material over a portion of the first collector layer 16B. The second collector layer 18B has a thickness that can range from between about 200 nm to about 400 nm in 1 nm increments or decrements. The donor impurity concentration of the second collector layer 18B can range between about $4 \times 1016$ cm$^{-3}$ and about $7 \times 10^{16}$ cm$^{-3}$. In one embodiment, the second collector layer 18B has a thickness of about 200 nm and a donor impurity concentration of about $5 \times 10^{16}$ cm$^{-3}$.

The third collector layer 20B is formed of a GaAs material over a portion of the second collector layer 18B. The third collector layer 20B has a thickness of between about 100 nm and about 500 nm. The range of thicknesses can change in increments or decrements of 1 nm. The donor impurity concentration of the third collector layer 20B can range between about $0.84 \times 10^{16}$ cm$^{-3}$ and about $4 \times 10^{16}$ cm$^{-3}$. In one embodiment, the third collector layer 20B has a thickness of about 400 nm and a donor impurity concentration of about $1 \times 10^{16}$ cm$^{-3}$.

For the base layer 22B, a P$^+$ type GaAs material is formed over a portion of the third collector layer 20B and is formed to have a thickness of about 100 nm. The base layer 22B is doped to have an impurity concentration of between about $1 \times 10^{19}$ cm$^{-3}$ and about $5 \times 10^{19}$ cm$^3$.

For the emitter layer 24B, a (Al$_x$Ga$_{1-x}$)$_{0.49}$ In$_{0.51}$P where (0<x<0.35) type material is formed over a portion of the base layer 22B to have a thickness of about 50 nm with a doping concentration between about $3 \times 10^{17}$ cm$^{-3}$ and about $10 \times 10^{17}$ cm$^{-3}$.

The first contact layer 26B is formed of a GaAs material doped with N$^+$ type impurities to a concentration of about $4 \times 10^{18}$ cm$^{-3}$. The first contact layer 26B is formed over a portion of the emitter layer 24B and is formed to have a thickness of about 100 nm. The second contact layer 28B is formed over a portion of the first contact layer 26B of an In$_{0.5}$Ga$_{0.5}$As material doped with N$^+$ type impurities in a concentration above $1 \times 10^{19}$ cm$^{-3}$.

The improvement in the on-state voltage breakdown V$_{CE}$ in the above illustrative embodiment of the compound semiconductor device is accomplished by the insertion of a higher doped collector layer near the sub-collector layer to reduce the electric field at the junction of the collector and the sub-collector of the HBT 10B. The introduction of collector layer having a donor impurity concentration of between about $7 \times 10^{16}$ cm$^{-3}$ and about $10 \times 10^{16}$ cm$^{-3}$ adjacent to a sub-collector layer reduces the electric field at the collector/sub-collector junction which avoids the occurrence of avalanche breakdown at this junction.

The electric field at the junction of a sub-collector layer and a collector layer is reduced from between about $6 \times 10^4$ V/cm to about $8 \times 10^4$ V/cm to a reduced level of between about $2 \times 10^4$ V/cm to about $3 \times 10^4$ V/cm. The reduction in the electric field results in an improvement of an on-state breakdown voltage $V_{CE}$ value of between about 9V and about 10V at a collector current density of about 80 kA/cm². As a result, the HBT 10B is able to realize an improvement in on-state breakdown voltage $V_{CE}$, thus improved output power characteristics and the ability to withstand large voltage swings to result in an improvement in device reliability and operational performance.

Figure 1C:
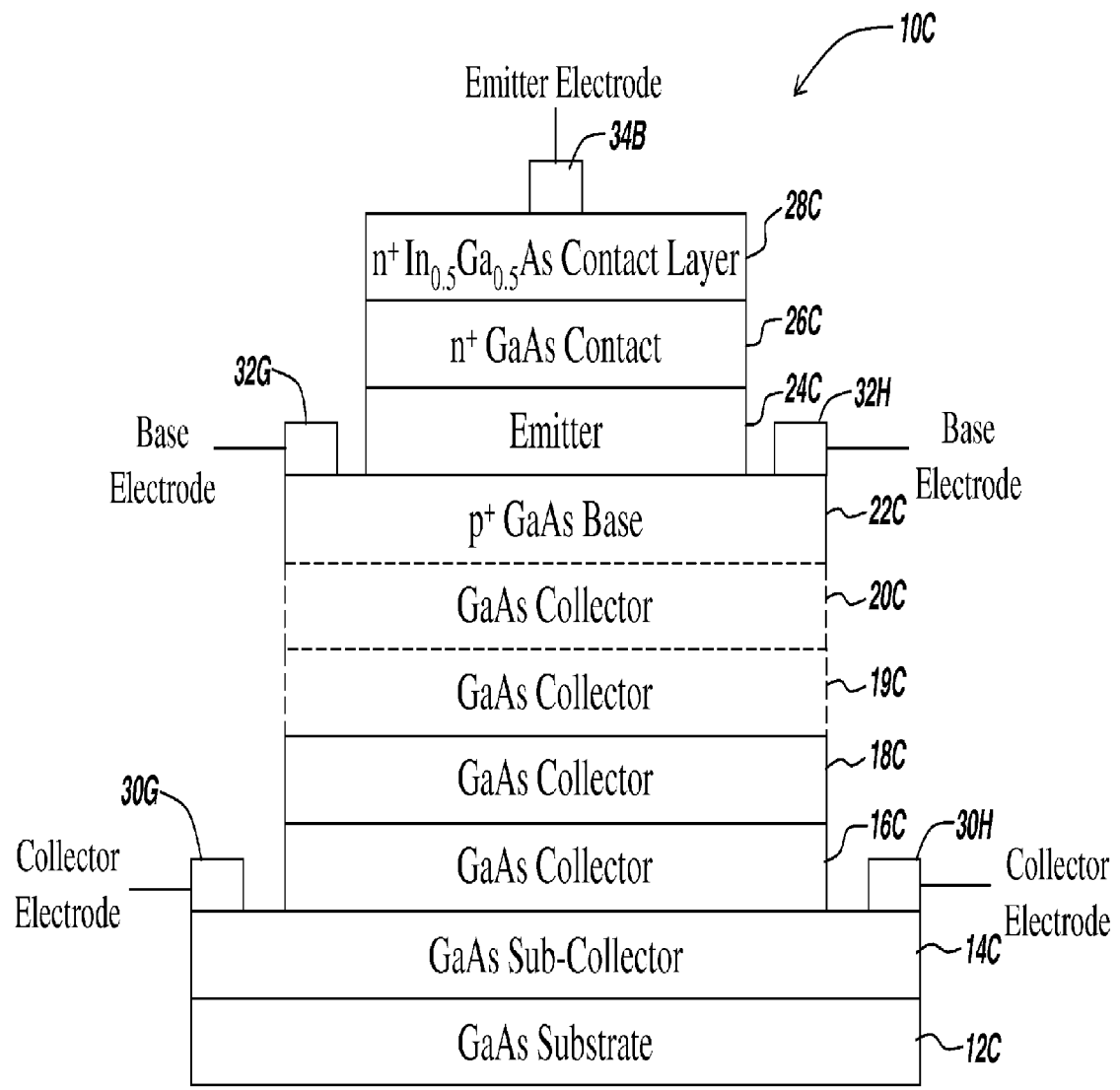
FIG. 1C is a cross-sectional view of a heterojunction bipolar transistor according to a fourth illustrative embodiment of the present invention.

FIG. 1C illustrates a cross sectional view of an HBT having optional collector layers in accordance with the teachings of the present invention. An HBT transistor in accordance with the present invention can have one or more collector layers in order to achieve and realize an improve on-state breakdown voltage ($V_{CE}$) and thus, improved output power characteristics and improved ability to withstand large voltage swings, as discussed above in relation to FIGS. 1, 1A, and 1B. FIG. 1C illustrates the HBT 10C can achieve the improved on-state breakdown voltage results discussed above, with at least two collector layers and optionally a third collector layer and if desired an optional fourth collector layer.

An HBT device having one collector layer in according with the teachings of the present invention is discussed below in more detail in relation to FIG. 3

The HBT 10C is formed on a substrate and includes a collector region, a base region, an emitter region, and a contact region. The collector region of the HBT 10C includes a sub-collector layer 14C, a first collector layer 16C, and a second collector layer 18C. The collector region of the HBT 10C can include a third collector layer 19C and if desired a fourth collector layer 20C. The base region of the HBT 10C includes a base layer 22C. In similar fashion, the emitter region of the HBT 10C includes an emitter layer 24C. The contact region of the HBT 10C includes a first contact layer 26C and a second contact layer 28C. The HBT 10C further includes an emitter electrode 34C formed over a portion of the second contact layer 28C, base electrodes 32G and 32H formed over portions of the base layer 22C, and collector electrodes 30G and 30H formed over portions of the sub-collector layer 14C.

In more detail, the sub-collector layer 14C is a GaAs material formed over a GaAs substrate 12C. The sub-collector layer 14C has a thickness of about 400 nm with a donor impurity concentration of about $4\times10^{18}$ cm⁻³.

The first collector layer 16C is formed of a GaAs material over a portion of the sub-collector layer 14C. The first collector layer 16C can have a thickness range of between about 200 nm and about 400 nm. The first collector layer 16C can have a donor impurity concentration of between about $7\times10^{16}$ cm⁻³ and about $10\times10^{16}$ cm⁻³.

The second collector layer 18C is formed of a GaAs material over a portion of the first collector layer 16C. The second collector layer 18C has a thickness that can range from between about 200 nm to about 400 nm in 1 nm increments or decrements. The donor impurity concentration of the second collector layer 18C can range between about $4\times10^{16}$ cm⁻³ and about $7\times10^{16}$ cm⁻³.

The third collector layer 19C is formed of a GaAs material over a portion of the second collector layer 18C. The third collector layer 19C has a thickness of between about 100 nm and about 500 nm. The range of thicknesses can change in increments or decrements of 1 nm. The donor impurity concentration of the third collector layer 19C can range between about $0.5\times10^{16}$ cm⁻³ and about $4\times10^{16}$ cm⁻³.

The fourth collector layer 20C is formed of a GaAs material over a portion of the third collector layer 19C. The fourth collector layer 20C has a thickness of between about 100 nm and about 500 nm. The range of thicknesses can change in increments or decrements of 1 nm. The donor impurity concentration of the fourth collector layer 20C can range between about $0.84\times10^{16}$ cm⁻³ and about $4\times10^{16}$ cm⁻³.

For the base layer 22C, a P⁺ type GaAs material is formed over a portion of either the second collector layer 18C, the third collector layer 19C, or the fourth collector layer 22C, and is formed to have a thickness of about 100 nm. The base layer 22C is doped to have an impurity concentration of between about $1\times10^{19}$ cm⁻³ and about $5\times10^{19}$ cm⁻³.

For the emitter layer 24C, either an InGaP type material, an $Al_xGa_{1-x}As$ where (0<x<0.35) type material, or a $(Al_xGa_{1-x})_{0.49}In_{0.51}P$ where (0<x<0.35) type material is formed over a portion of the base layer 22C to have a thickness of about 50 nm with a doping concentration between about $3\times10^{17}$ cm⁻³ and about $10\times10^{17}$ cm⁻³.

The first contact layer 26B is formed of a GaAs material doped with N⁺ type impurities to a concentration of about $4\times10^{18}$ cm⁻³. The first contact layer 26B is formed over a portion of the emitter layer 24B and is formed to have a thickness of about 100 nm. The second contact layer 28B is formed over a portion of the first contact layer 26B of an $In_{0.5}Ga_{0.5}As$ material doped with N⁺ type impurities in a concentration above $1\times10^{19}$ cm⁻³.

The improvement in the on-state voltage breakdown $V_{CE}$ in the above illustrative embodiments of the compound semiconductor device is accomplished by the insertion of a higher doped collector layer near the sub-collector layer to reduce the electric field at the junction of the collector and the sub-collector of the HBT 10C. The introduction of collector layer having a donor impurity concentration of between about $7\times10^{16}$ cm⁻³ and about $10\times10^{16}$ cm⁻³ adjacent to a sub-collector layer reduces the electric field at the collector/sub-collector junction which avoids the occurrence of avalanche breakdown at this junction.

The electric field at the junction of a sub-collector layer and a collector layer is reduced from between about $6\times10^4$ V/cm to about $8\times10^4$ V/cm to a reduced level of between about $2\times10^4$ V/cm to about $3\times10^4$ V/cm. The reduction in the electric field results in an improvement of an on-state breakdown voltage $V_{CE}$ value of between about 9V and about 10V at a collector current density of about 80 kA/cm². As a result, the HBT 10C is able to realize an improvement in on-state breakdown voltage $V_{CE}$, thus improved output power characteristics and the ability to withstand large voltage swings to result in an improvement in device reliability and operational performance.

Figure 2:
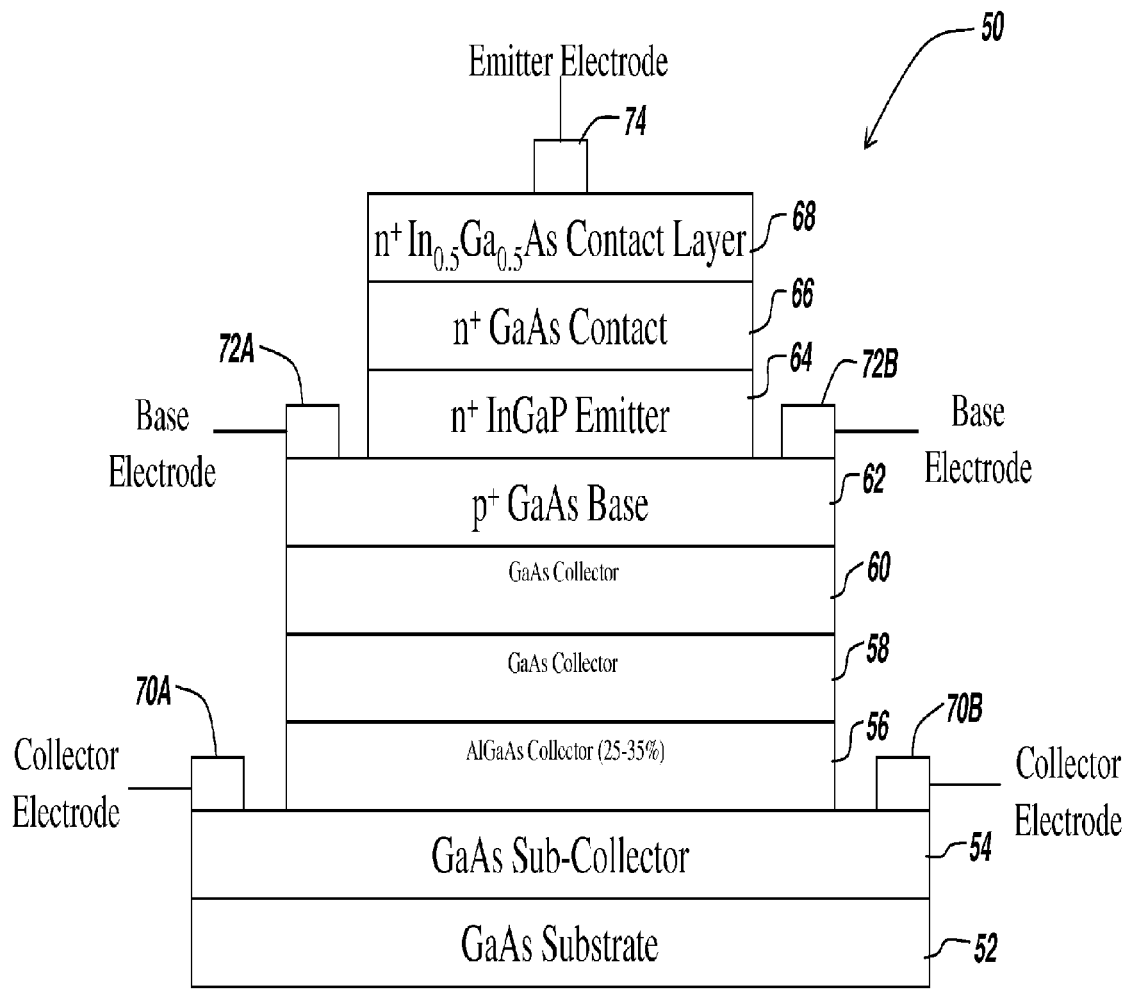
FIG. 2 is a cross-sectional view of a heterojunction bipolar transistor according to a fifth illustrative embodiment of the present invention.

FIG. 2 illustrates a cross-sectional view of an HBT according to another illustrative embodiment of the present invention. The HBT 50 is formed on a substrate and includes a collector region, a base region, an emitter region and a contact region. The collector region of the HBT 50 includes a sub-collector layer 54, a first collector layer 56, a second collector layer 58, and a third collector layer 60. The base region of the HBT 50 includes a base layer 62. The emitter region of the HBT 50 includes an emitter layer 64. In like manner, the contact region of the HBT 50 includes a first contact layer 66 and a second contact layer 68.

The HBT 50 further includes an emitter electrode 74 formed over a portion of the second contact layer 68, base electrodes 72A and 72B formed over portions of the base layer 62, and collector electrodes 70A and 70B formed over portions the sub-collector layer 54.

In more detail, the substrate 52 is a GaAs material. The sub-collector layer 54 is a GaAs material formed over the substrate 52 and is formed to have a thickness of about 400 nm with a donor impurity concentration of $4\times10^{18}$ cm⁻³. The first collector layer 56 is formed of an AlGaAs material with an Al concentration of between about 25% to about 35% and is formed to have a thickness of about 200 nm. The first collector layer 56 has an impurity concentration of between about $7 \times 10^{16}$ cm$^{-3}$ and about $10 \times 10^{16}$ cm$^{-3}$.

In like manner, the second collector layer 58 is formed of a GaAs material having a thickness of 200 nm and an impurity concentration of between about $4 \times 10^{16}$ cm$^{-3}$ and about $7 \times 10^{16}$ cm$^{-3}$. The second collector layer 58 is formed over a portion of the first collector layer 56. The third collector layer 60 is formed over a portion of the second collector layer 58 and is formed of a GaAs material. The third collector layer 60 has a thickness of about 400 nm and has a low impurity concentration of between about $0.5 \times 10^{16}$ cm$^{-3}$ and about $4 \times 10^{16}$ cm$^{-3}$.

For the base layer 62, a GaAs material is formed over a portion of the third collector layer 60 and is formed to have a thickness of 100 nm. The base layer 62 is doped to have a P$^+$ acceptor impurity concentration of between about $1 \times 10^{19}$ cm$^{-3}$ and about $5 \times 10^{19}$ cm$^{-3}$.

For the emitter layer 64, an N$^+$ type InGaP material is formed to a thickness of about 50 nm with a donor impurity concentration of about $3 \times 10^{17}$ cm$^{-3}$. The first contact layer 66 is formed over a portion of the emitter layer 64. The first contact layer 66 is formed of a GaAs material to a thickness of about 100 nm with an N$^+$ donor impurity concentration of about $4 \times 10^{18}$ cm$^{-3}$. The second contact layer 68 is formed of an In$_{0.5}$Ga$_{0.5}$As material doped with N$^+$ type impurities in a high concentration in excess of $1 \times 10^{19}$ cm$^{-3}$. The second contact layer 68 is formed to have a thickness of 100 nm.

The improvement in the on-state voltage breakdown V$_{CE}$ in the above illustrative embodiment of the compound semiconductor device is accomplished by the insertion of a high composition AlGaAs near the sub-collector layer to reduce the electric field at the junction of the collector and the sub-collector of the HBT 50. The introduction of collector layer having a high composition of AlGaAs adjacent a sub-collector layer reduces the electric field at the collector/sub-collector heterojunction, and hence reduces or suppresses the electric field near this junction.

A reduction in the electric field at the junction of a sub-collector layer and a collector layer from between about $6 \times 10^4$ V/cm and about $8 \times 10^4$ V/cm to a reduced level of between about $2 \times 10^4$ V/cm and about $3 \times 10^4$ V/cm is realized and results in an improvement of an on-state breakdown voltage V$_{CE}$ value of between about 8V and about 10V at a collector current density of between about 60 kA/cm$^2$ and about 80 kA/cm$^2$. The high composition AlGaAs increases the bandgap of the collector region in the HBT 50 and as a consequence diminishes the saturation stored charged density of the device and speeds up device turnoff after the device is biased in the saturation region. As a result, the HBT 50 is able to realize an improvement in on-state breakdown voltage V$_{CE}$, thus improved output power characteristics, and the ability to withstand large voltage swings to result in an improvement in device reliability and operational performance.

Figure 3:
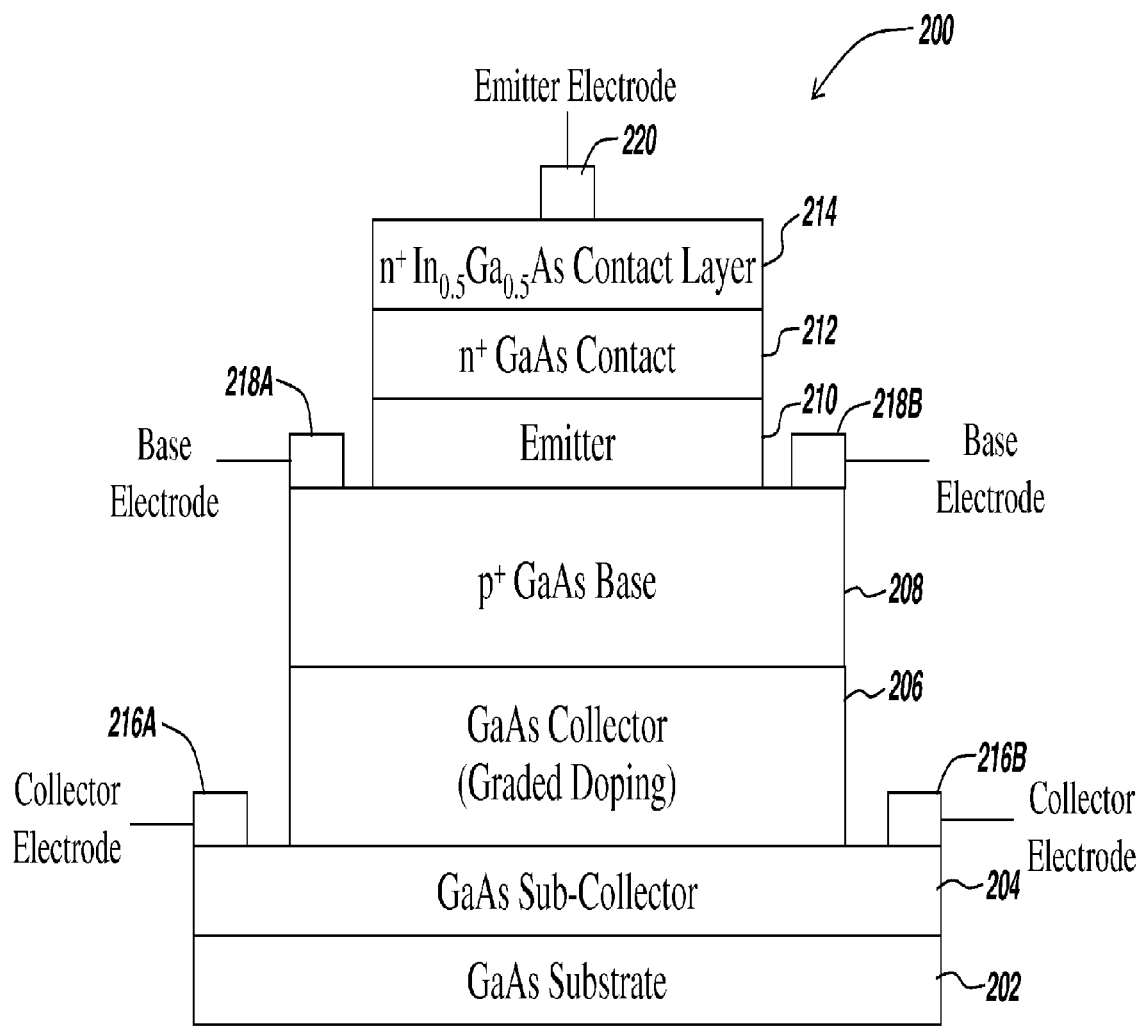
FIG. 3 is a cross-sectional view of a heterojunction bipolar transistor according to a sixth illustrative embodiment of the present invention.

FIG. 3 illustrates a cross sectional view of an HBT according to another illustrative embodiment of the present invention. The HBT 200 is formed with one collector layer having a graded doping concentration to achieve an improved on-state breakdown voltage (V$_{CE}$) and thus, improved output characteristics and improved ability to withstand large voltage swings, as discussed above in relation to FIGS. 1, 1A, 1B, 1C, and 2. The graded doping concentration of the collector layer in HBT 200 allows for the formation of a single collector layer as an alternative to formation of multiple collector layers as discussed above in relation to FIGS. 1, 1A, 1B, 1C, and 2, to achieve the reduced on-state breakdown voltage as taught by the present invention.

The HBT 200 is formed on a substrate and includes a collector region, a base region, an emitter region, and a contact region. The collector region of the HBT 200 includes a sub-collector layer 204 and a collector layer 206. The base region of the HBT 200 includes a base layer 208. In similar fashion, the emitter region of the HBT 200 includes an emitter layer 210. The contact region of the HBT 200 includes a first contact layer 212 and a second contact layer 214. The HBT 200 further includes an emitter electrode 220 formed over a portion of the second contact layer 214, base electrodes 218A and 218B formed over portions of the base layer 208, and collector electrodes 216A and 216B formed over portions of the sub-collector layer 204.

In more detail, the sub-collector layer 204 is a GaAs material formed over a GaAs substrate 202. The sub-collector layer 204 has a thickness of about 400 nm with a donor impurity concentration of about $4 \times 10^{18}$ cm$^{-3}$.

The collector layer 206 is formed of a GaAs material over a portion of the sub-collector layer 204. The collector layer 206 can have a thickness range of between about 200 nm and about 1000 nm and has a graded or ramped doping concentration.

The graded doping concentration of the collector layer 206 is carried out to achieve a doping concentration that increases in a downward direction from a first surface of the collector layer 206 adjacent the base layer 208 to a second surface of the collector layer 206 adjacent to a surface of the sub-collector layer 204. One suitable graded doping concentration can range from between about $1 \times 10^{16}$ cm$^{-3}$ adjacent the first surface of the collector layer 206 and graded or ramped to increase in concentration of between about $7 \times 10^{16}$ cm$^{-3}$ to about $10 \times 10^{16}$ cm$^{-3}$ at the second surface of the collector 206 adjacent the surface of the sub-collector 204. In one embodiment of the HBT 200 the doping concentration of the collector layer 206 at the second surface of the collector 206 adjacent the surface of the sub-collector 204 is about $8 \times 10^{16}$ cm$^{-3}$.

For the base layer 208, a P$^+$ type GaAs material is formed over a portion of the collector layer 206 and is formed to have a thickness of about 100 nm. The base layer 206 is doped to have an impurity concentration of between about $1 \times 10^{19}$ cm$^{-3}$ and about $5 \times 10^{19}$ cm$^{-3}$.

For the emitter layer 210, either an InGaP type material, an Al$_x$Ga$_{1-x}$As where (0<x<0.35) type material, or a (Al$_x$Ga$_{1-x}$)$_{0.49}$In$_{0.51}$P where (0<x<0.35) type material is formed over a portion of the base layer 208 to have a thickness of about 50 nm with a doping concentration between about $3 \times 10^{17}$ cm$^{-3}$ and about $10 \times 10^{17}$ cm$^{-3}$.

The first contact layer 212 is formed of a GaAs material doped with N$^+$ type impurities to a concentration of about $4 \times 10^{18}$ cm$^{-3}$. The first contact layer 212 is formed over a portion of the emitter layer 210 and is formed to have a thickness of about 100 nm. The second contact layer 214 is formed over a portion of the first contact layer 212 of an In$_{0.5}$Ga$_{0.5}$As material doped with N$^+$ type impurities in a concentration above $1 \times 10^{19}$ cm$^3$.

The improvement in the on-state voltage breakdown V$_{CE}$ in the above illustrative embodiment of the compound semiconductor device is accomplished by the insertion of a higher doped collector layer near the sub-collector layer to reduce the electric field at the junction of the collector and the sub-collector of the HBT 200. The introduction of collector layer having a donor impurity concentration of between about $7 \times 10^{16}$ cm$^{-3}$ and about $10 \times 10^{16}$ cm$^{-3}$ adjacent to a sub-collector layer reduces the electric field at the collector/sub-collector junction which avoids the occurrence of avalanche breakdown at this junction.

The electric field at the junction of a sub-collector layer and a collector layer is reduced from between about $6 \times 10^4$ V/cm to about $8 \times 10^4$ V/cm to a reduced level of between about $2 \times 10^4$ V/cm to about $3 \times 10^4$ V/cm. The reduction in the electric field results in an improvement of an on-state breakdown voltage $V_{CE}$ value of between about 9V and about 10V at a collector current density of about 80 kA/cm². The high donor impurity concentration adjacent the sub-collector layer increases the bandgap of the collector region in the HBT 200, diminishes the saturation stored charged density of the device, and speeds up device turnoff after the device is biased in the saturation region. As a result, the HBT 200 is able to realize an improvement in on-state breakdown voltage $V_{CE}$, thus improved output power characteristics and the ability to withstand large voltage swings to result in an improvement in device reliability and operational performance.

Figure 4:
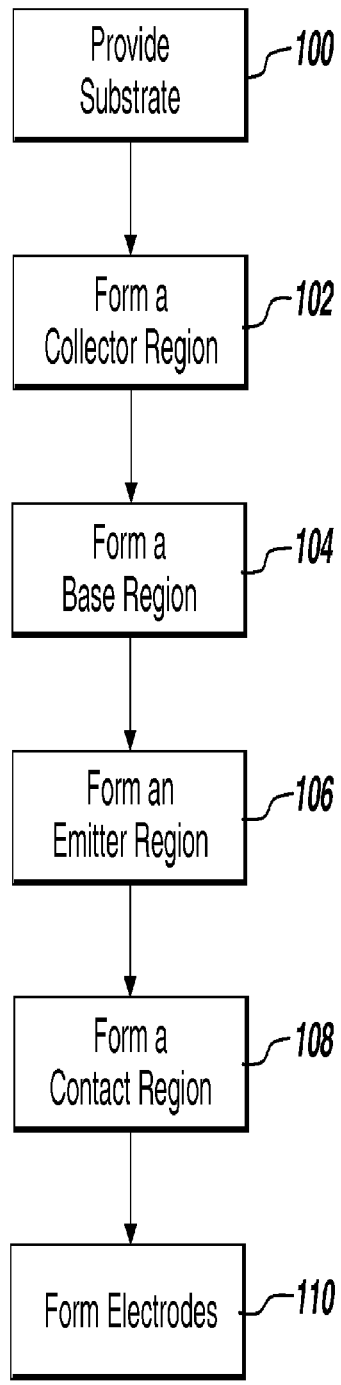
FIG. 4 is a schematic flow-chart diagram illustrating a method for fabricating either of heterojunction bipolar transistors illustrated in FIGS. 1, 1A, 1B, 1C, 2, and 3.

FIG. 4 illustrate the steps taken to form one of the illustrative compound semiconductor devices of the present invention. On a provided substrate (step 100) a collector region is formed having at least one layer to form a first stack (step 102). Suitable techniques for forming the collector region include metal organic chemical vapor deposition (MOCVD) or molecular beam epitaxy (MBE). Upon formation of the collective region, a base region is formed or grown over a portion of the collector region (step 104). The base region is formed to include at least one layer and forms a second stack. An emitter region is grown or formed over a portion of the base region to form a third stack (step 106). The emitter region is formed to have at least one layer. In similar fashion, a contact region is grown or formed over a portion of the emitter region to form a fourth stack (step 108). The contact region is formed to have at least one layer. The emitter electrode, the base electrodes, and the collector electrodes are formed by metal deposition and liftoff, self-aligned or non-self-aligned, using a material of Ti, Au, Ni, W, Ge, Pt. (step 110). Those skilled in the art will recognize that each of the stacks discussed above are capable of being formed by MOCVD or by MBE. Nonetheless, those skilled in the art will recognize that other fabrication methods may be suitable depending on feature sizes or other constraints such as material type.

Figure 5:
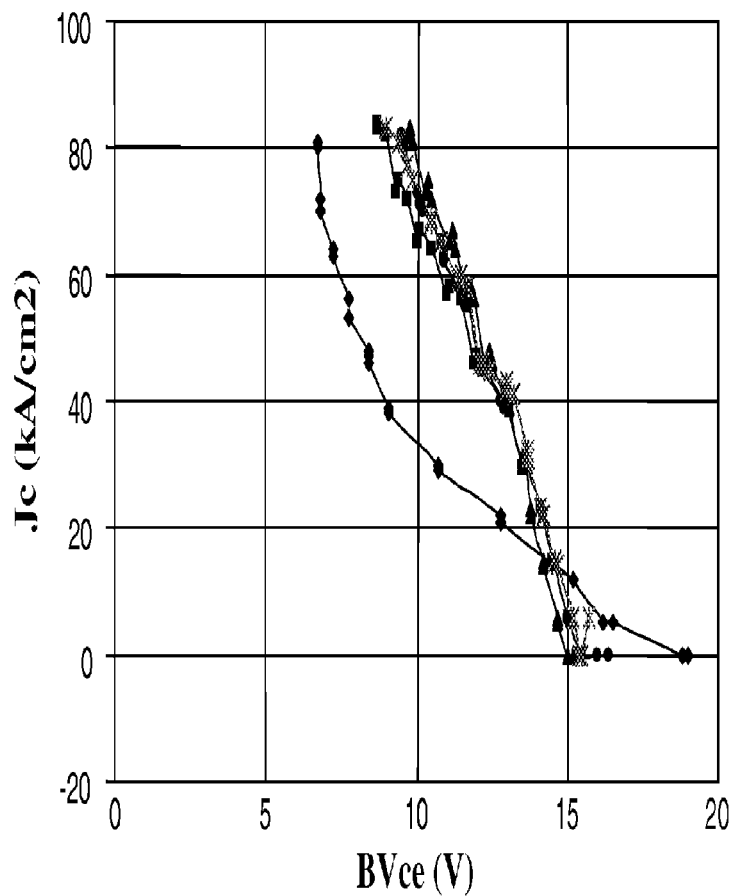
FIG. 5 is a graph representing improved on state voltage breakdown of heterojunction bipolar transistors according to the teachings of the present invention.

FIG. 5 graphically illustrates the improvement in the on-state breakdown voltage ($V_{CE}$) and thus, improved output power characteristics and improved ability to withstand large voltage swings of an HBT device according to the teachings of the present invention. Graph 410 graphically depicts the measured results of four HBT devices having a reduced electric field near the collector/subcollector junction as a result of a high donor impurity concentration of the collector region adjacent the sub-collector layer to increase the bandgap of the collector region of an HBT device. Graph 410 plots current density $J_C$ versus on-state breakdown voltage $V_{CE}$ for four HBT devices. HBT device labeled InGaP refers to a conventional HBT device having a subcollector layer with a thickness of about 500 nm and a doping concentration of about $4 \times 10^{18}$ cm$^{-3}$ and a single collector layer formed of GaAs having a thickness of about 10000 nm with a doping concentration of about $1 \times 10^{16}$ cm$^{-3}$. The HBT device labeled Collector-1 in graph 410 represents an HBT device according to FIG. 1. The HBT device labeled Collector 2 in graph 410 represents an HBT device depicted by any of FIGS. 1, 1A, and 1B. The HBT device labeled Collector-3 of graph 410 represents an HBT device having four collector layers as illustrated in FIG. 1C. The HBT device labeled Collector-AlGaAs of FIG. 410 represents results of an HBT having a structure similar to HBT 50 of FIG. 2.

FIG. 410 graphically illustrates that the on-state breakdown voltage $V_{CE}$ of the conventional (InGaP) HBT device has an on-state breakdown voltage between six and seven volts when the current density $J_C$ reaches about 80 kA/cm². Contrary to the conventional HBT, HBT devices according to the teachings of the present invention are able to improve the on-state breakdown voltage $V_{CE}$ performance at high current densities. For example, at a current density of about 80 kA/cm² the devices labeled Collector 1-3 and Collector-AlGaAs resulted in on-state breakdown voltages that range between about 9V about 10V while the conventional InGaP HBT device realized an on-state breakdown voltage of about 6.5 V.

Those skilled in art will appreciate that the applications of the various compound semiconductor devices described herein are not limited solely to terrestrial based digital communications, for example, the compound semiconductor devices of the present invention are well suited for operation in portable or mobile electronic devices capable of communicating with a satellite network in a wireless manner or a hybrid network of terrestrial network entities and satellite network entities.

While the present invention has been described with reference to illustrative embodiments thereof, those skilled in the art will appreciate that various changes in form in detail may be made without parting from the intended scope of the present invention as defined in the appended claims.

What is claimed is:

1. A heterojunction bipolar transistor, comprising
 a substrate;
 a collector region having a total thickness falling in a range of about 800 nm to about 2200 nm, the collector region including,
  a sub-collector formed of a first material and having a first impurity concentration,
  a first collector layer formed of the first material having a second impurity concentration formed on the sub-collector,
  a second collector layer formed of the first material and having a third impurity concentration, and
  a third collector layer formed of the first material and having a fourth impurity concentration;
 a base region having at least one layer formed of said first material;
 an emitter region having at least one layer formed of a second material; and
 a contact region having at least one layer formed of a third material;
 wherein the first impurity concentration is greater than the second impurity concentration and the second impurity concentration is greater than or equal to the third impurity concentration, and
 wherein, when a voltage is applied across the heterojunction bipolar transistor, the impurity concentrations of the first and second collector layers reduce a resulting electric field in the collector region to increase an on-state breakdown voltage ($V_{CE}$) of the heterojunction bipolar transistor.

2. The heterojunction bipolar transistor of claim 1, wherein the first material comprises GaAs.

3. The heterojunction bipolar transistor of claim 1, wherein the first collector layer has a thickness of at least 200 nm.

4. The heterojunction bipolar transistor of claim 1, wherein the second collector layer has a thickness of at least 200 nm.

5. The heterojunction bipolar transistor of claim 1, wherein the second material comprises $(Al_xGa_{1-x})_{0.49}In_{0.51}P$ (0<x<0.35).

6. The heterojunction bipolar transistor of claim 1, wherein the third material comprises $In_{0.5}Ga_{0.5}As$.

7. The heterojunction bipolar transistor of claim 1, wherein the fourth impurity concentration is less than the third impurity concentration.

8. The heterojunction bipolar transistor of claim 1, wherein the fourth impurity concentration is less than the first impurity concentration.

9. The heterojunction bipolar transistor of claim 1, wherein an electric field in a region between the sub-collector and the first collector layer is reduced to less than $6 \times 10^4$ V/cm (On state).

10. A heterojunction bipolar transistor, comprising
a substrate;
a collector region having,
  a sub-collector formed of a first material,
  a first collector layer formed of the first material having a first impurity concentration,
  a second collector layer formed of the first material and having a second impurity concentration, and
  a third collector layer formed of the first material and having a third impurity concentration;
a base region having at least one layer formed of said first material;
an emitter region having at least one layer formed of a second material; and
a contact region having at least one layer formed of a third material;
wherein, when a voltage is applied across the heterojunction bipolar transistor, the first and second impurity concentrations of the first and second collector layers reduce a resulting electric field in a region between the sub-collector and the first collector layer to less than $6 \times 10^4$ V/cm (On state) to increase an on-state breakdown voltage ($V_{CE}$) of the heterojunction bipolar transistor.

11. The heterojunction bipolar transistor of claim 10, wherein the first material comprises GaAs.

12. The heterojunction bipolar transistor of claim 10, wherein the first collector layer has a thickness of at least 200 nm.

13. The heterojunction bipolar transistor of claim 10, wherein the second collector layer has a thickness of at least 200 nm.

14. The heterojunction bipolar transistor of claim 10, wherein the second material comprises $(Al_xGa_{1-x})_{0.49}In_{0.51}P$ (0<x<0.35).

15. The heterojunction bipolar transistor of claim 10, wherein the third material comprises $In_{0.5}Ga_{0.5}As$.

16. The heterojunction bipolar transistor of claim 10, wherein the first impurity concentration is greater than the second impurity concentration.

17. The heterojunction bipolar transistor of claim 10, wherein the third impurity concentration is less than the second impurity concentration.

18. The heterojunction bipolar transistor of claim 10, wherein the third impurity concentration is less than the first impurity concentration.

19. The heterojunction bipolar transistor of claim 10, wherein the sub-collector layer has an impurity concentration greater than the first impurity concentration.

* * * * *